US 7,674,681 B2

(12) United States Patent
Sung

(10) Patent No.: US 7,674,681 B2
(45) Date of Patent: Mar. 9, 2010

(54) SEMICONDUCTOR DEVICE AND METHOD FOR MANUFACTURING THE SAME

(75) Inventor: Woong Je Sung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 34 days.

(21) Appl. No.: 11/638,111

(22) Filed: Dec. 12, 2006

(65) Prior Publication Data

US 2007/0145531 A1 Jun. 28, 2007

(30) Foreign Application Priority Data

Dec. 28, 2005 (KR) .................. 10-2005-0132655

(51) Int. Cl.
*H01L 21/331* (2006.01)
(52) U.S. Cl. .................. 438/309; 437/337; 437/366; 257/E27.015
(58) Field of Classification Search ......... 438/309–342; 257/E27.015
See application file for complete search history.

(56) References Cited

U.S. PATENT DOCUMENTS

| 5,045,493 | A | * | 9/1991 | Kameyama et al. ......... 438/234 |
| 5,789,769 | A | * | 8/1998 | Yamazaki .................... 257/263 |
| 5,960,273 | A | * | 9/1999 | Nakashima ................. 438/207 |
| 6,995,068 | B1 | * | 2/2006 | Racanelli et al. ............ 438/379 |

* cited by examiner

*Primary Examiner*—H. Jey Tsai
(74) *Attorney, Agent, or Firm*—The Law Offices of Andrew D. Fortney; Andrew D. Fortney; William K. Nelson

(57) ABSTRACT

Disclosed are a semiconductor device and a method for manufacturing the same. The semiconductor device includes a semiconductor substrate including first and second well areas doped with second conductive ions, a third well area in the first well and doped with the second conductive ions, a base area in the third well and doped with first conductive ions, an emitter area in the third well and doped with the second conductive ions, an emitter electrode on the emitter area, a first contact plug in contact with the emitter electrode, a second contact plug in contact with the base area, a collector area in the second well and doped with the second conductive ions, and a third contact plug in contact with the collector area.

19 Claims, 4 Drawing Sheets

SEMICONDUCTOR DEVICE AND METHOD FOR MANUFACTURING THE SAME

FIELD OF THE INVENTION

The present invention relates to a semiconductor device. More particularly, the present invention relates to a bipolar transistor and a method for manufacturing the same.

DESCRIPTION OF THE RELATED ART

Recently, as the requirement of a high speed signal processing device increases, studies and research for a bipolar transistor capable of reducing base resistance by narrowing the distance between a base area and an emitter area have actively progressed.

FIG. 1 is a sectional view of a conventional bipolar transistor.

Referring to FIG. 1, a buried layer 110 is formed on a semiconductor substrate 100, and isolation layers 140 defining active areas are formed over the buried layer 110.

In addition, a first well 120a, in which the first active area is formed, and second wells 120b, in which the second active areas are formed, are formed on the buried layer 110.

In addition, an emitter area 150b and a base area 152b are formed in the first active area of the first well 120a, and a collector area 156a is formed in the second active area of the second well 120b.

The emitter area 150b is connected to an emitter electrode 150a joined to a first contact plug 150c, the collector area 156a is connected to a second contact plug 156c, and the base area 152b is connected to a base electrode 152a joined to a third contact plug 152c.

A pad oxide layer 160 is formed between the base electrode 152a and the emitter electrode 150a.

In addition, the first to third contact plugs 150c, 156c, and 152c are connected through an interlayer dielectric layer 170 to the emitter area 150b, the collector area 156a, and the base area 152b, respectively.

Meanwhile, in the bipolar transistor, the emitter electrode 150a is isolated from the base electrode 152a by the pad oxide layer 160, and ions doped into the emitter electrode 150a diffuse to form the emitter area 150b. In addition, ions doped into the base electrode 152a diffuse to form the base area 152b.

However, when the bipolar transistor is formed as described above, the bipolar transistor has following disadvantages.

The interlayer insulating layer 170 including the emitter electrode 150a and the base electrode 152a must have a large thickness in order to ensure a process margin during a chemical mechanical polishing (CMP) process for forming the contact plugs of the electrodes. Therefore, it can be difficult to highly integrate semiconductor devices.

In addition, since the emitter electrode 150a and the base electrode 152a are formed separately (e.g., by separate polysilicon layer forming, patterning and etching processes, it can be difficult to simplify the manufacturing process.

Further, when performing an etching process for forming the contact plugs, the polysilicon layer for forming the electrodes may be damaged.

SUMMARY OF THE INVENTION

Accordingly, the present invention has been made to solve the above-mentioned problems, and an object of the present invention is to provide a semiconductor device and a method for manufacturing the same, capable of integrating devices and simplifying a manufacturing process of the semiconductor device.

In order to accomplish the object, there is provided a semiconductor device including a semiconductor substrate including a first well area and a second well area doped with second conductive ions, a third well area in the first well and doped with the second conductive ions, a base area in the third well and doped with first conductive ions, an emitter area in the third well and doped with the second conductive ions, an emitter electrode on the emitter area, a first contact plug in contact with the emitter electrode, a second contact plug in contact with the base area, a collector area in the second well and doped with the second conductive ions, and a third contact plug in contact with the collector area.

According to another aspect according to the present invention, there is provided a method for manufacturing a semiconductor device, including the steps of doping a semiconductor substrate with first conductive ions to form first and second well areas, forming a collector area by implanting first conductive ions into the second well area, forming a third well area by implanting second conductive ions into the first well area, and forming a base area by implanting the first conductive ions into the third well area, exposing the third well area by patterning the semiconductor substrate, forming a spacer on the exposed, patterned semiconductor substrate, forming an emitter electrode by forming a conductive layer in contact with the third well area and then patterning the conductive layer; and forming first, second, and third contact plugs in contact with the emitter electrode, the base area, and the collector area, respectively.

According to the present invention, after forming the emitter electrode (e.g., using polysilicon doped with P-type ions), the emitter area is formed by diffusing the dopant (e.g., the P-type ions) in the emitter electrode. In this case, since a predetermined distance is maintained between the base area, which may be (re)formed by diffusing ions implanted into the base area, and the emitter area, it is possible to reduce a resistance of the base area.

In addition, in one embodiment, only the emitter electrode includes a polysilicon layer. In this embodiment, it is possible to reduce the thickness of the interlayer dielectric layer and ensure a process margin during the chemical mechanical polishing (CMP) process for forming the contact plugs. Accordingly, it is possible to integrate bipolar semiconductor devices more highly.

In this latter embodiment (and possibly others), since only a single polysilicon layer is used, a manufacturing process is simplified. Further, in one implementation, the base electrode does not include a structure formed from a polysilicon layer. As a result, it is possible to reduce the use of the polysilicon layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a semiconductor device and a method for manufacturing the same according to an embodiment of the present invention will be described with reference to the accompanying drawings.

FIGS. 2 to 8 are sectional views showing a method for manufacturing a semiconductor device according to an embodiment of the present invention.

In the following description, a semiconductor substrate 10 is assumed to be doped with first conductive impurities, which in one embodiment, are P-type impurities. However, according to another embodiment of the present invention, first conductive impurities may include N-type impurities, and second conductive impurities may include P-type impurities.

Figure 1:
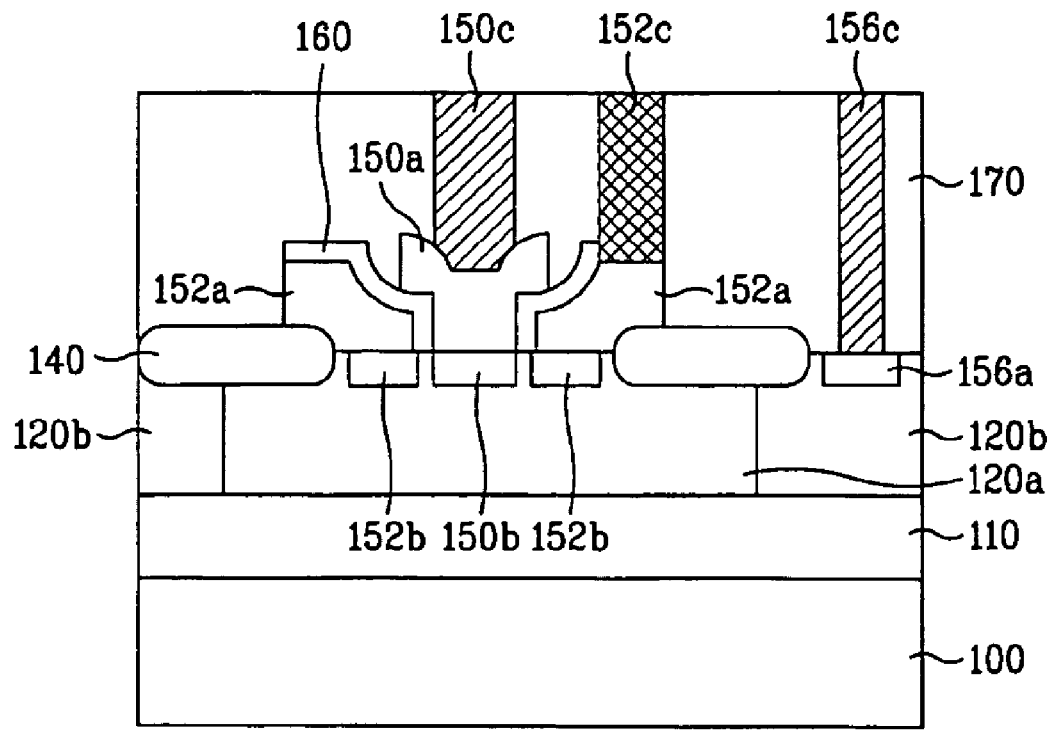
FIG. 1 is a cross-sectional view of a conventional bipolar transistor.
Figure 2:
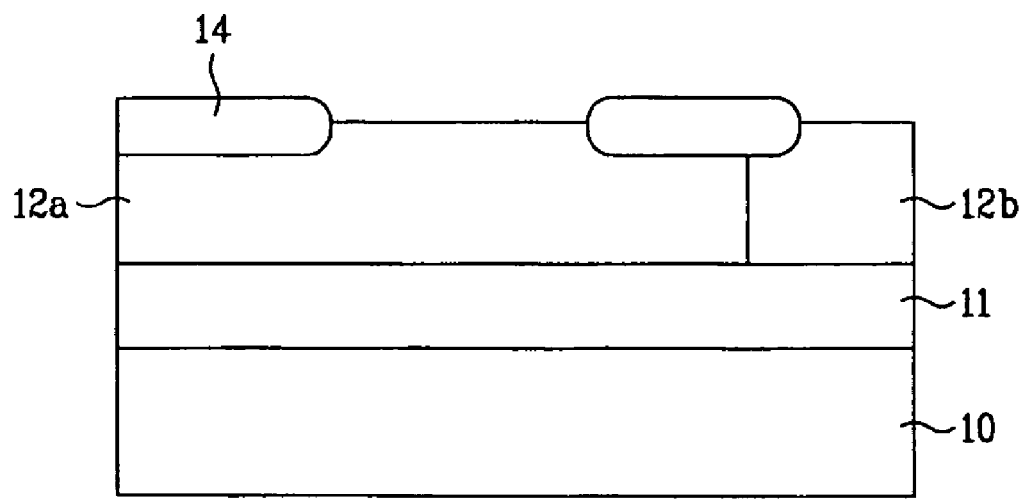
FIGS. 2 to 8 are cross-sectional views showing various steps in a method for manufacturing a semiconductor device according to an embodiment of the present invention.

Referring to FIG. 2, the semiconductor substrate 10 includes a P-type silicon substrate with an N-type buried layer 11, which is a second type buried layer opposite to the first conductive type substrate 10, formed on a predetermined active area of the semiconductor substrate 10.

Then, a first well 12a and a second well 12b doped with N-type impurities, which are (in this embodiment) second conductive impurities, are formed in the buried layer 11. Alternatively, since the first and second wells 12a and 12b may be formed by blanket implantation (e.g., without a mask) of the same type of dopant, at the same energy and the same dose, a single well "12" having the second conductive type may be formed in the substrate, at a depth less than that of the buried layer 11.

In addition, in order to isolate terminals (or devices) of a bipolar transistor from each other, isolation layers 14 are formed in a field area of the semiconductor substrate 10.

The isolation layer 14 divides the active area of the semiconductor substrate 10 into an emitter/base area and a collector area, so that the active area of the semiconductor substrate 10 is divided into a first active area (or first well area 12a) for the emitter/base area and a second active area (or second well area 12b) for the collector area.

Figure 3:
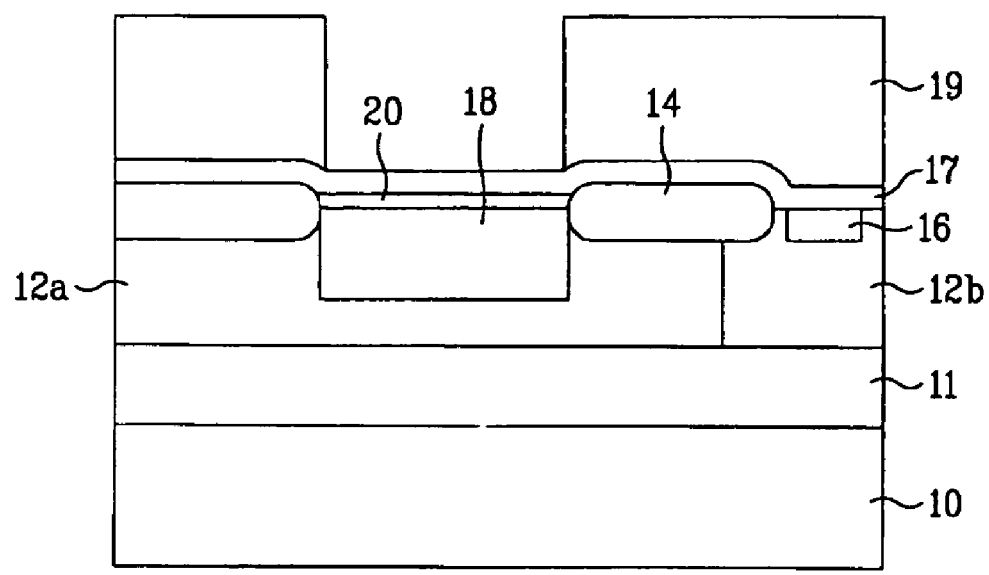

Referring to FIG. 3, a photolithographic patterning process and an ion implantation process are performed with respect to the semiconductor substrate 10 having the isolation layers 14 thereon, thereby forming an N-type collector area 16 in the second well area 12b of the second active area.

Then, after growing a pad oxide layer 17 on the resultant structure the N-type collector area 16 therein, photoresist is coated on the pad oxide layer 17, and then a photolithographic patterning process is performed with respect to the resultant structure such that a first photoresist pattern 19 is formed.

In this case, the first photoresist pattern 19 is used for forming the base area.

A low-density P-type ion implantation process is then performed, thereby forming a third well 18 in the first well area 12a of the first active area.

Then, a high-density P-type ion implantation process is performed with respect to the third well 18 using the first photoresist pattern 19 as a mask, thereby forming the base area 20. The ion implantation process that forms the base area 20 includes a higher dopant dose and lower energy than the ion implantation process that forms the third well 18.

Figure 4:
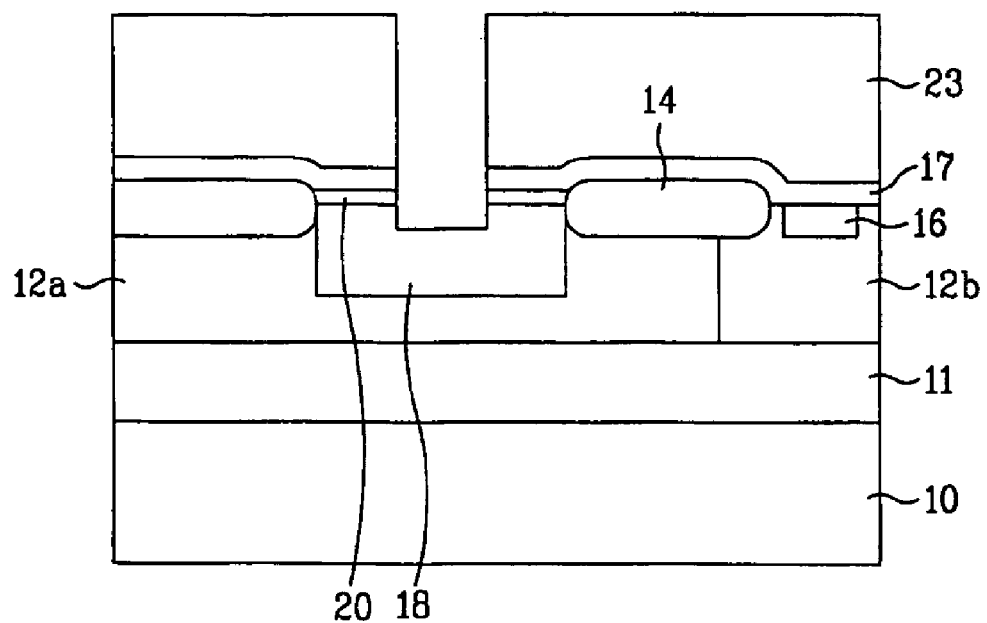

Referring to FIG. 4, after removing the first photoresist pattern 19, photoresist is coated on the semiconductor substrate 10 having the third well 18 and the base area 20 therein, and then a photolithographic patterning process is performed with respect to the resultant structure, such that the second photoresist pattern 23 is formed.

In this case, the second photoresist pattern 23 is used for forming an emitter area.

Then, predetermined portions of the pad oxide layer 17 and the semiconductor substrate 10 are etched to a predetermined depth (generally greater than the depth of the base area 20; e.g., at least 200, 500 or 1000 Å greater) using the second photoresist pattern 23 as a mask. Through such an etching process, the pad oxide layer 17 is patterned, and the third well 18 formed on the semiconductor substrate 10 is exposed such that a relatively shallow trench is formed therein, having a depth, e.g., of at least 200, 500 or 1000 Å.

Meanwhile, if the third well 18 is exposed through the etching process, the base area 20 may be divided.

Figure 5:
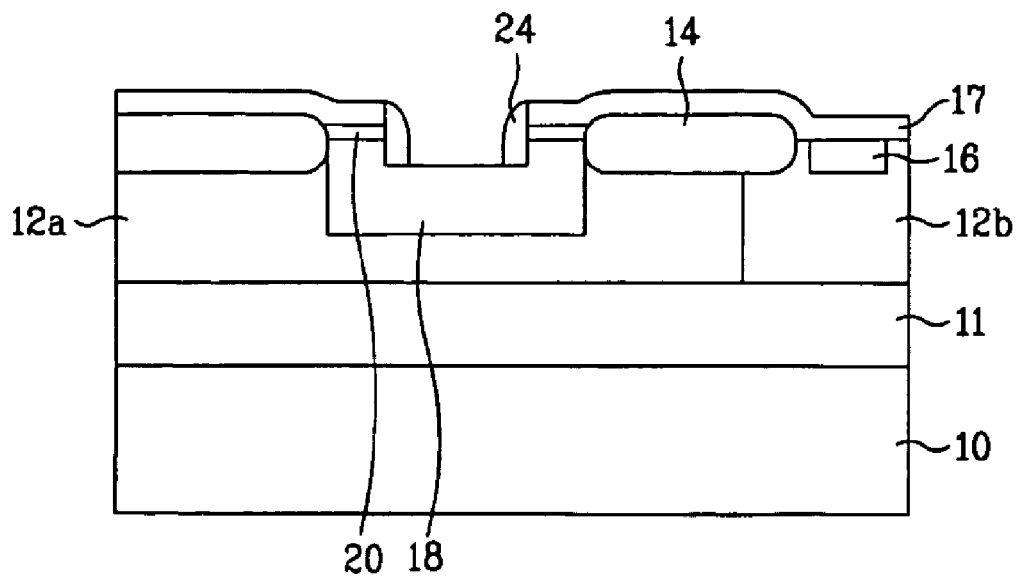

Referring to FIG. 5, after removing the second photoresist pattern 23 and depositing an oxide layer on the semiconductor substrate 10, an etching process such as an etch back or anisotropic (e.g., dry plasma) etching process is performed with respect to the resultant structure, thereby forming spacers 24 at sidewalls of the patterned pad oxide layer 17 and the etched semiconductor substrate (i.e., the trench in the third well 18, through the base area 20).

Figure 6:
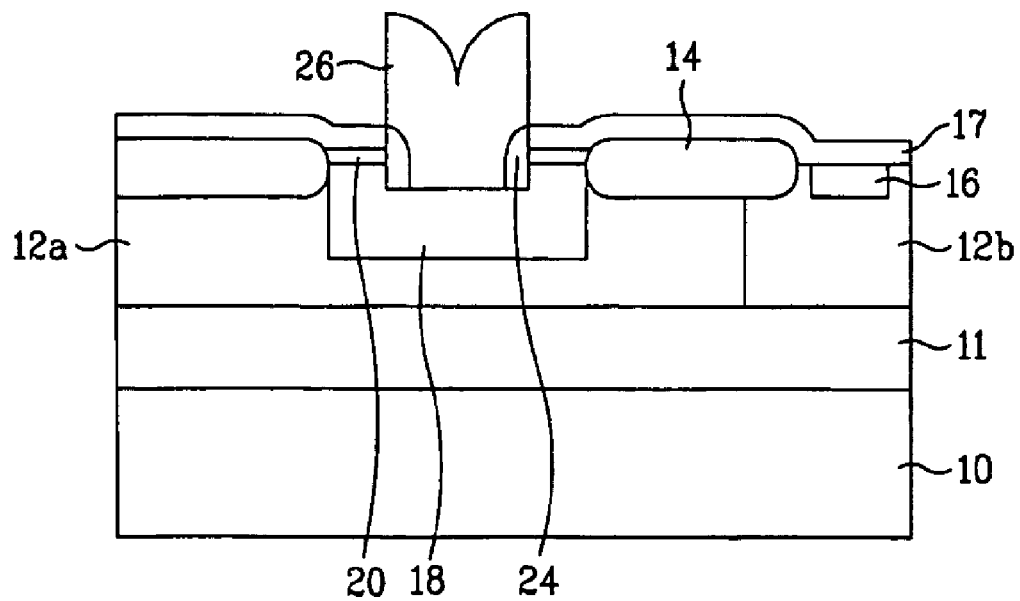

Referring to FIG. 6, an N-type doped (second conductive type) polysilicon layer is deposited on the semiconductor substrate 10, and a predetermined photoresist pattern is formed on the poly-silicon layer in order to form an emitter electrode. Preferably, the second conductive type dopant is present in a concentration (or implanted at a dose) greater than that of the first conductive type dopant in the third well 18.

Then, an etching process is performed with respect to the polysilicon layer using the predetermined photoresist pattern as an etching mask, thereby forming the emitter electrode 26 shown in FIG. 6.

Figure 7:
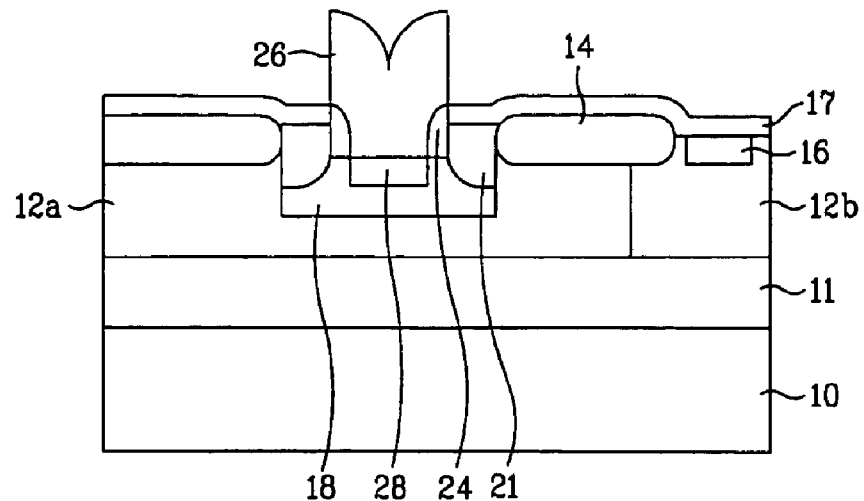

Referring to FIG. 7, a diffusion process is performed with respect to the semiconductor substrate 10 formed with the emitter electrode 26. That is, N-type ions in the emitter electrode 26 are diffused into the third well 18, thereby forming an emitter area 28. Generally, the diffusion process comprises heating or annealing the substrate at a temperature and for a length of time sufficient to form the emitter area 28.

Thereafter, simultaneously, or even before the diffusion process for forming the emitter area 28, P-type ions implanted into the base area 20 are diffused through the same or a different diffusion process, so a base area 21 is (re) formed with a depth similar to the depth of the emitter area 28.

Through the diffusion process, the emitter area 28 and the new base area 21 may be formed with similar depths due to the difference in the diffusion coefficients between the second conductive type (e.g., N-type) ions doped into the emitter electrode 26 and the first conductive type (e.g., P-type) ions doped into the base area 20 shown in FIG. 6.

In addition, the base area 21 maintains a predetermined distance with respect to the emitter area 28 due to the spacer 24.

Figure 8:
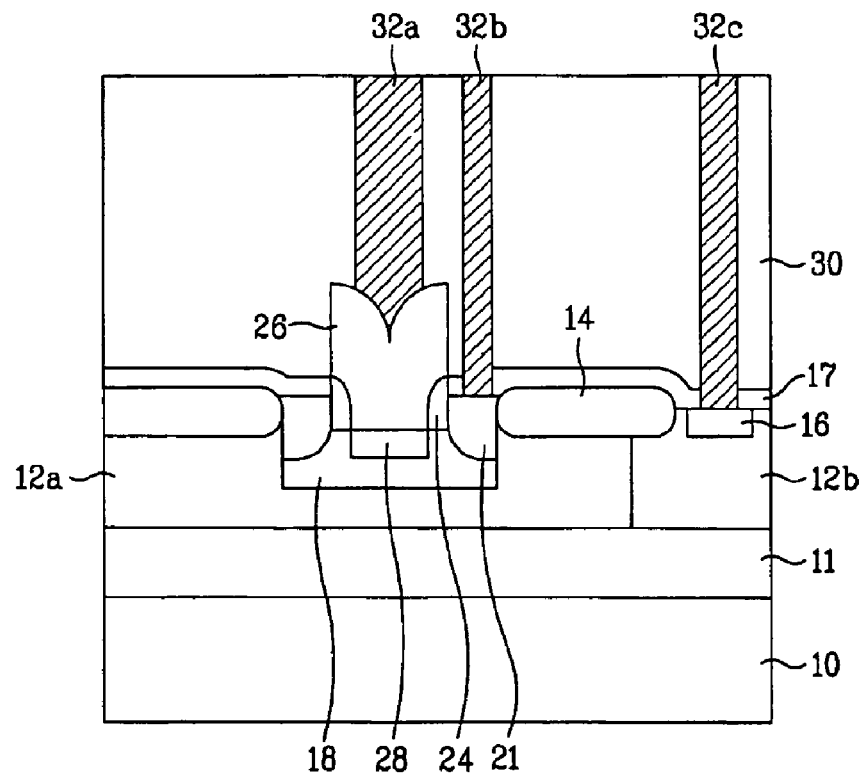

Referring to FIG. 8, an interlayer dielectric layer 30 is formed on the semiconductor substrate 10 having the emitter area 28 and the base area 21 therein.

Then, a predetermined photoresist pattern is formed on the interlayer dielectric layer 30, and contact holes exposing the emitter electrode (connected to the emitter area 28), the base area 21 and the collector area 16, respectively, are formed using the photoresist pattern as an etching mask.

Thereafter, a conductive layer (such as tungsten or copper) is deposited into the contact holes (e.g., by chemical vapor deposition or plating) until the contact holes are filled with the conductive layer, then a planarization process (such as chemical mechanical polishing) is performed until the interlayer dielectric layer 30 is exposed, thereby forming contact plugs 32a, 32b, and 32c in contact with the emitter electrode 26, the base area 21, and the collector area 16, respectively.

Meanwhile, after forming the emitter electrode 26 using the polysilicon layer doped with P-type ions, the emitter area 28 is formed by diffusing the P-type ions into the substrate. In this case, since a predetermined distance is maintained between the base area 20, which is (re) formed by diffusing ions implanted into the third well, and the emitter area 28, it is possible to reduce a resistance of the base area.

In addition, since only the emitter electrode 26 includes the polysilicon layer in the exemplary embodiment described herein, it is possible to reduce the thickness of the interlayer dielectric layer while still ensuring a process margin during the chemical mechanical polishing (CMP) process for forming the contact plugs. Accordingly, it is possible to make highly integrated bipolar devices.

In addition, since only the emitter electrode includes the polysilicon layer in the exemplary embodiment described herein, a manufacturing process is simplified. Further, since the base electrode does not include the polysilicon layer in the exemplary embodiment described herein, it is possible to reduce the use of the polysilicon layer.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, the method comprising the steps of:
    doping a semiconductor substrate with first conductive-type ions to form first and second well areas;
    forming a collector area by implanting further first conductive-type ions into the second well area;
    forming a third well area by implanting second conductive-type ions into the first well area, and forming a base area by implanting further second conductive-type ions into the third well area at a high density;
    exposing the third well area by patterning the semiconductor substrate;
    forming a spacer along a sidewall of the patterned, exposed semiconductor substrate;
    forming a conductive layer doped with first-conductive type ions in contact with the third well area and separated from the base area by the spacer;
    patterning the conductive layer to form an emitter electrode;
    heating the semiconductor substrate to diffuse the first conductive-type ions from the emitter electrode to form an emitter area in the third well, wherein the emitter area is separated from the base area by a predetermined distance;
    forming a dielectric layer over the semiconductor substrate;
    forming contact holes in the dielectric layer exposing the emitter electrode, and the base and collector areas of the semiconductor substrate;
    forming first, second, and third contact plugs in contact with the emitter electrode, the base area of the semiconductor substrate, and the collector area of the semiconductor substrate, respectively.

2. The method as claimed in claim 1, wherein heating the semiconductor substrate comprises reforming the base area by diffusing the second conductive-type ions implanted into the third well area.

3. The method as claimed in claim 1, wherein the step of forming the first, second, and third contact plugs includes
    filling the contact holes with a conductive layer, thereby forming the first, second, and third contact plugs.

4. The method as claimed in claim 1, wherein the conductive layer includes a polysilicon layer doped with the first conductive-type ions.

5. The method as claimed in claim 1, wherein the first conductive-type ions include N-type ions and the second conductive-type ions include P-type ions.

6. The method as claimed in claim 1, farther comprising a step of growing a pad oxide layer, after forming the first and second well areas on the semiconductor substrate.

7. The method as claimed in claim 1, wherein the step of forming the spacer includes the steps of:
    depositing an oxide layer on the semiconductor substrate; and
    anisotropically etching the oxide layer such that the oxide layer remains at an upper side of the exposed third well area.

8. The method as claimed in claim 1, wherein patterning the semiconductor substrate comprises etching the semiconductor substrate to a predetermined depth.

9. A method for manufacturing a semiconductor device, the method comprising the steps of:
    forming an isolation layer in an isolation area of a semiconductor substrate having first and second well areas doped with first conductive-type ions;
    forming a collector area by implanting first conductive-type ions into the second well area;
    forming a third well area by implanting second conductive-type ions at a low density into the first well area;
    forming a base area by implanting second conductive-type ions at a high density into the third well area;
    exposing the third well area by patterning the semiconductor substrate;
    forming a spacer including an oxide layer at a sidewall of the patterned, exposed semiconductor substrate;
    forming an emitter electrode that contacts the third well area by forming a conductive layer doped with first conductive-type ions on an entire surface of the semiconductor substrate and on the spacer, and then patterning the conductive layer, wherein the conductive layer is separated from the base area by the spacer;
    forming an emitter area in the third well area by diffusing the first conductive-type ions from the emitter electrode, wherein the base area and the emitter area are separated by a predetermined distance;
    forming a dielectric layer over an entire surface of the semiconductor substrate;
    forming contact holes in the dielectric layer exposing the emitter electrode, and the base and collector areas of the semiconductor substrate; and
    forming first, second, and third contact plugs in contact with the emitter electrode, the base area of the semiconductor substrate, and the collector area of the semiconductor substrate, respectively.

10. The method as claimed in claim 9,
    wherein forming first, second, and third contact plugs comprises filling the contact holes with a conductive layer, thereby forming contact plugs which contact the emitter electrode, the base area, and the collector area, respectively.

11. The method as claimed in claim 9, wherein the conductive layer includes a polysilicon layer doped with the first conductive-type ions.

12. The method as claimed in claim 9, wherein patterning the semiconductor substrate comprises etching the semiconductor substrate to a predetermined depth.

13. The method as claimed in claim 9, wherein the semiconductor substrate comprises a first conductive-type silicon substrate.

14. The method as claimed in claim 13, wherein the semiconductor substrate further comprises a second conductive-type buried layer.

15. The method as claimed in claim 13, wherein the semiconductor substrate consists essentially of said first conductive-type silicon substrate and a second conductive-type buried layer.

16. The method as claimed in claim 1, wherein the semiconductor substrate comprises a first conductive-type silicon substrate.

17. The method as claimed in claim 16, wherein the semiconductor substrate further comprises a second conductive-type buried layer.

18. The method as claimed in claim 16, wherein the semiconductor substrate consists essentially of said first conductive-type silicon substrate and a second conductive-type buried layer.

19. The method as claimed in claim 9, wherein forming an emitter area comprises heating the semiconductor substrate and simultaneously reforming the base area by diffusing the second conductive-type ions implanted into the third well area.

* * * * *